(12) United States Patent
Ellingson

(10) Patent No.: US 9,745,794 B2
(45) Date of Patent: Aug. 29, 2017

(54) APPARATUS FOR SEALING DOOR OF AN ENCLOSURE

(71) Applicant: Jeffrey S. Ellingson, Woodbury, MN (US)

(72) Inventor: Jeffrey S. Ellingson, Woodbury, MN (US)

( * ) Notice: Subject to any disclaimer, the term of this patent is extended or adjusted under 35 U.S.C. 154(b) by 0 days.

(21) Appl. No.: 14/488,244

(22) Filed: Sep. 16, 2014

(65) Prior Publication Data

US 2015/0075080 A1    Mar. 19, 2015

Related U.S. Application Data

(60) Provisional application No. 61/878,054, filed on Sep. 16, 2013.

(51) Int. Cl.
| | |
|---|---|
| *E06B 7/23* | (2006.01) |
| *H05K 5/06* | (2006.01) |
| *H02B 1/28* | (2006.01) |
| *H02B 1/40* | (2006.01) |

(52) U.S. Cl.
CPC .......... *E06B 7/2309* (2013.01); *E06B 7/2305* (2013.01); *E06B 7/2312* (2013.01); *H02B 1/28* (2013.01); *H05K 5/061* (2013.01); *H02B 1/40* (2013.01)

(58) Field of Classification Search
CPC .... E06B 7/2309; E06B 7/2305; E06B 7/2312; H05K 5/061
USPC ........ 49/490.1, 484.1, 495.1, 498.1; 312/245
See application file for complete search history.

(56) References Cited

U.S. PATENT DOCUMENTS

| | | | |
|---|---|---|---|
| 2,234,773 A | 3/1941 | Orcutt | |
| 5,711,706 A | 1/1998 | Griffin | |
| 6,128,861 A * | 10/2000 | Calamari | B60J 5/0487 |
| | | | 49/490.1 |
| 6,243,990 B1 * | 6/2001 | Cornils | B60J 10/081 |
| | | | 49/490.1 |
| 6,393,766 B2 | 5/2002 | Nozaki | |
| 6,536,161 B2 | 3/2003 | Saito | |
| (Continued) | | | |

FOREIGN PATENT DOCUMENTS

| | | | | |
|---|---|---|---|---|
| CN | 203413907 | | 1/2014 | |
| DE | 29517327 | * | 3/1997 | ........... E06B 7/2309 |
| EP | 0176619 B1 | * | 5/1988 | ........... E06B 7/2309 |

OTHER PUBLICATIONS

Translation of DE 29517327.*

*Primary Examiner* — Katherine Mitchell
*Assistant Examiner* — Marcus Menezes
(74) *Attorney, Agent, or Firm* — Krenz Patent Law, LLC

(57) ABSTRACT

An apparatus for sealing an enclosure having a front and a back and an opening on the front. A door with an inner face and an outer face, and the door is rotatably mounted to the front of the enclosure and configured to cover the opening when the door is closed. A first rim surrounds a periphery of the opening and has a first outer edge. A first gasket is attached to the first rim and configured to form a watertight seal between the front of the enclosure and the door when the door is closed. A second rim on the door is sized to surround the periphery of the opening when the door is closed. A second gasket is attached the second rim and configured to form a watertight seal between the front of the enclosure and the door when the door is closed.

16 Claims, 12 Drawing Sheets

(56) References Cited

U.S. PATENT DOCUMENTS

| | | | | |
|---|---|---|---|---|
| 6,746,092 B2* | 6/2004 | Leccia | ................... | H02B 1/38 |
| | | | | 292/300 |
| 6,837,005 B2* | 1/2005 | Arata | .................. | B60J 10/0005 |
| | | | | 296/146.9 |
| 7,871,137 B2* | 1/2011 | Schulz | ................... | H02B 1/28 |
| | | | | 312/296 |
| 8,579,150 B2* | 11/2013 | Janny | ................ | B65D 43/0212 |
| | | | | 220/310.1 |
| 2005/0029210 A1* | 2/2005 | Perkins | ................. | A47B 21/06 |
| | | | | 211/94.01 |
| 2011/0072729 A1* | 3/2011 | Otsuka | ................ | B60J 10/0031 |
| | | | | 49/490.1 |

\* cited by examiner

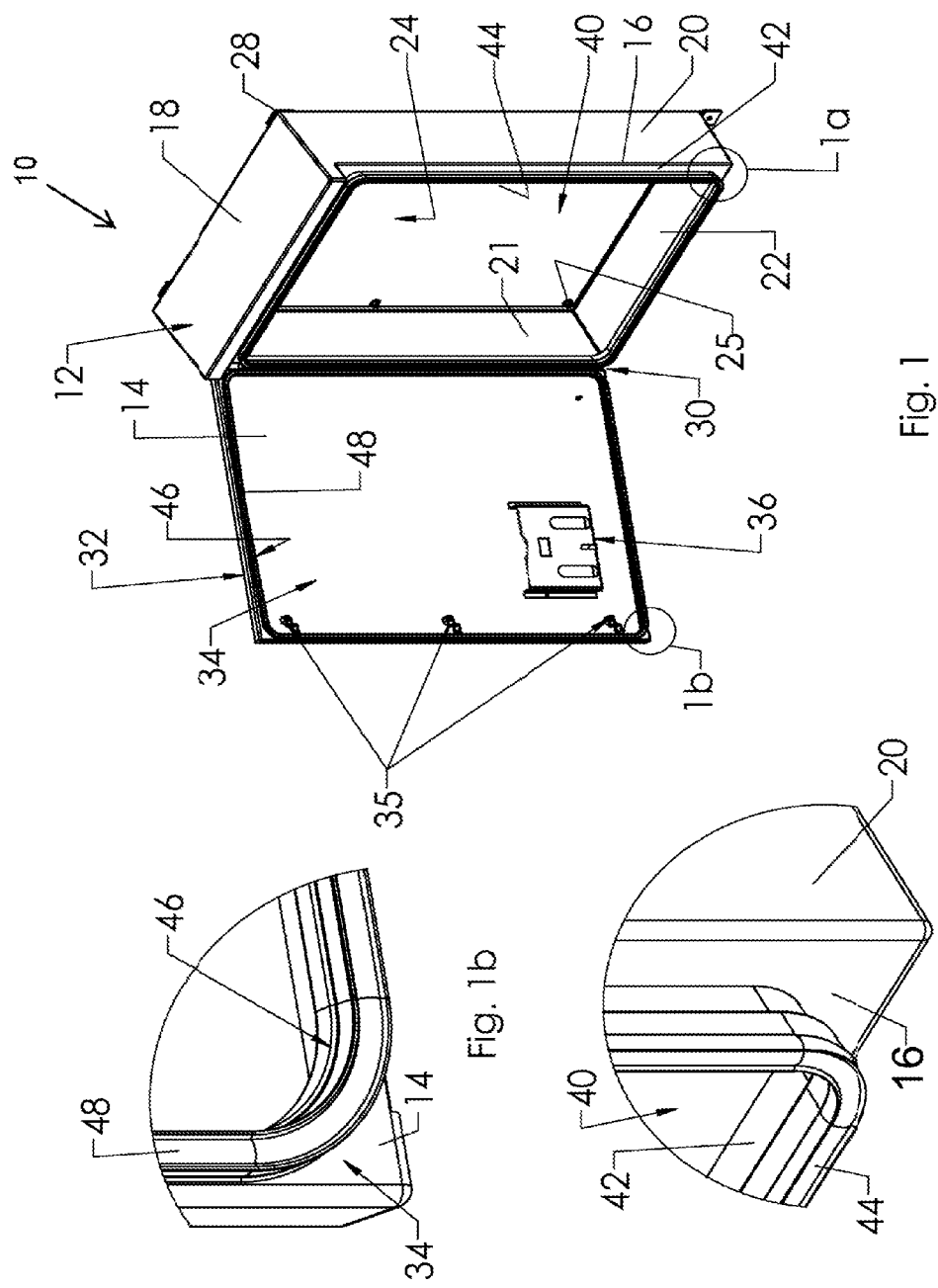

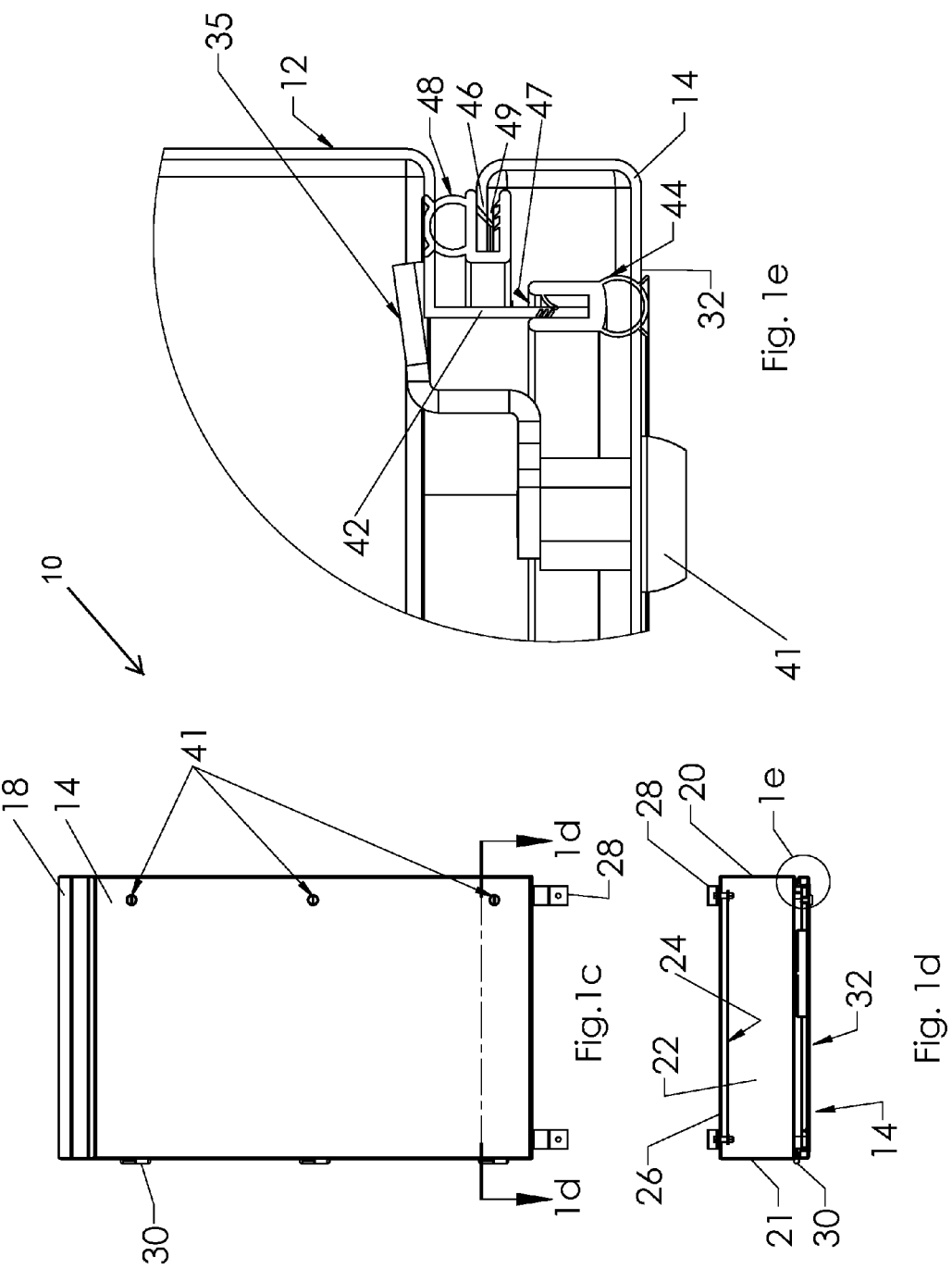

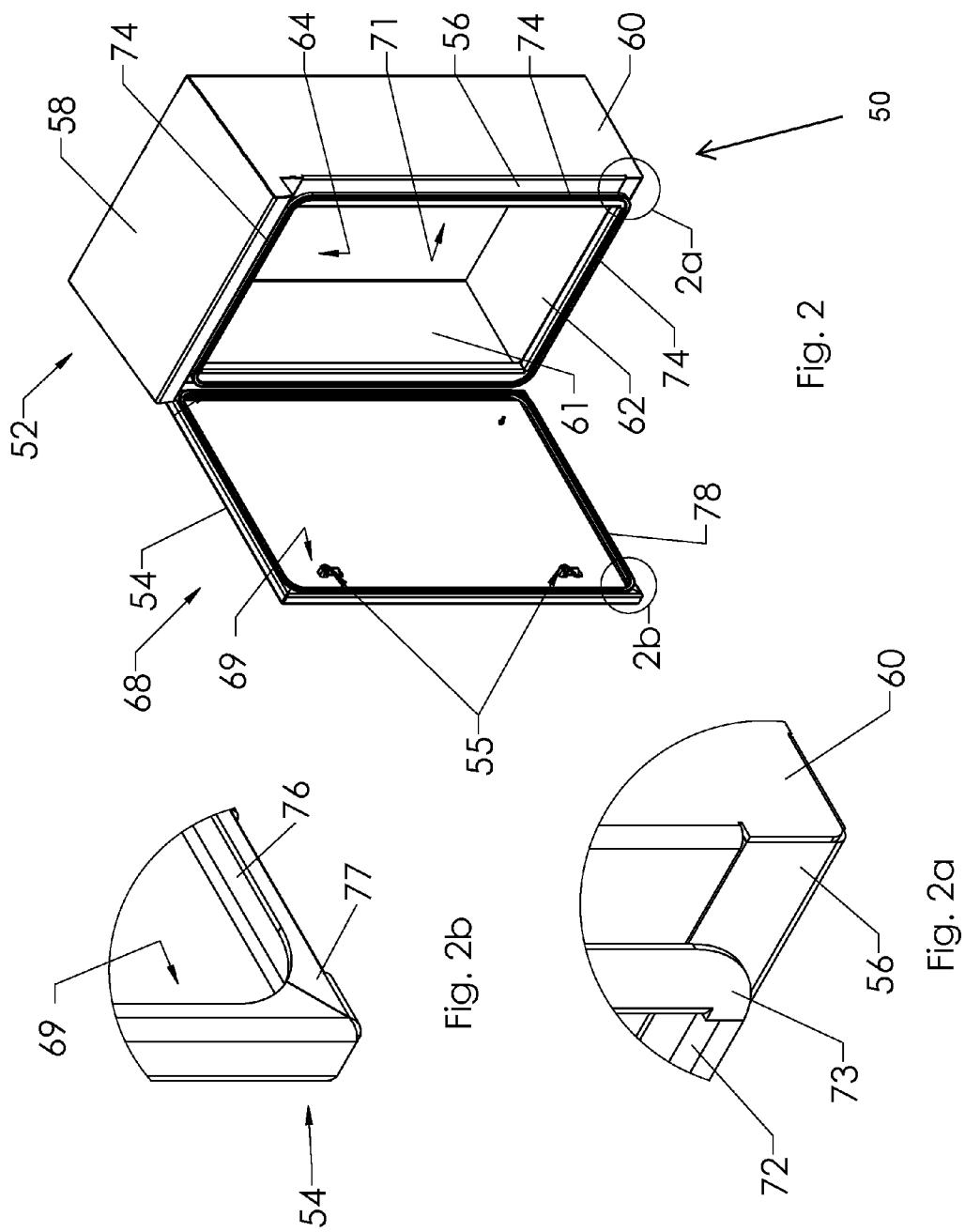

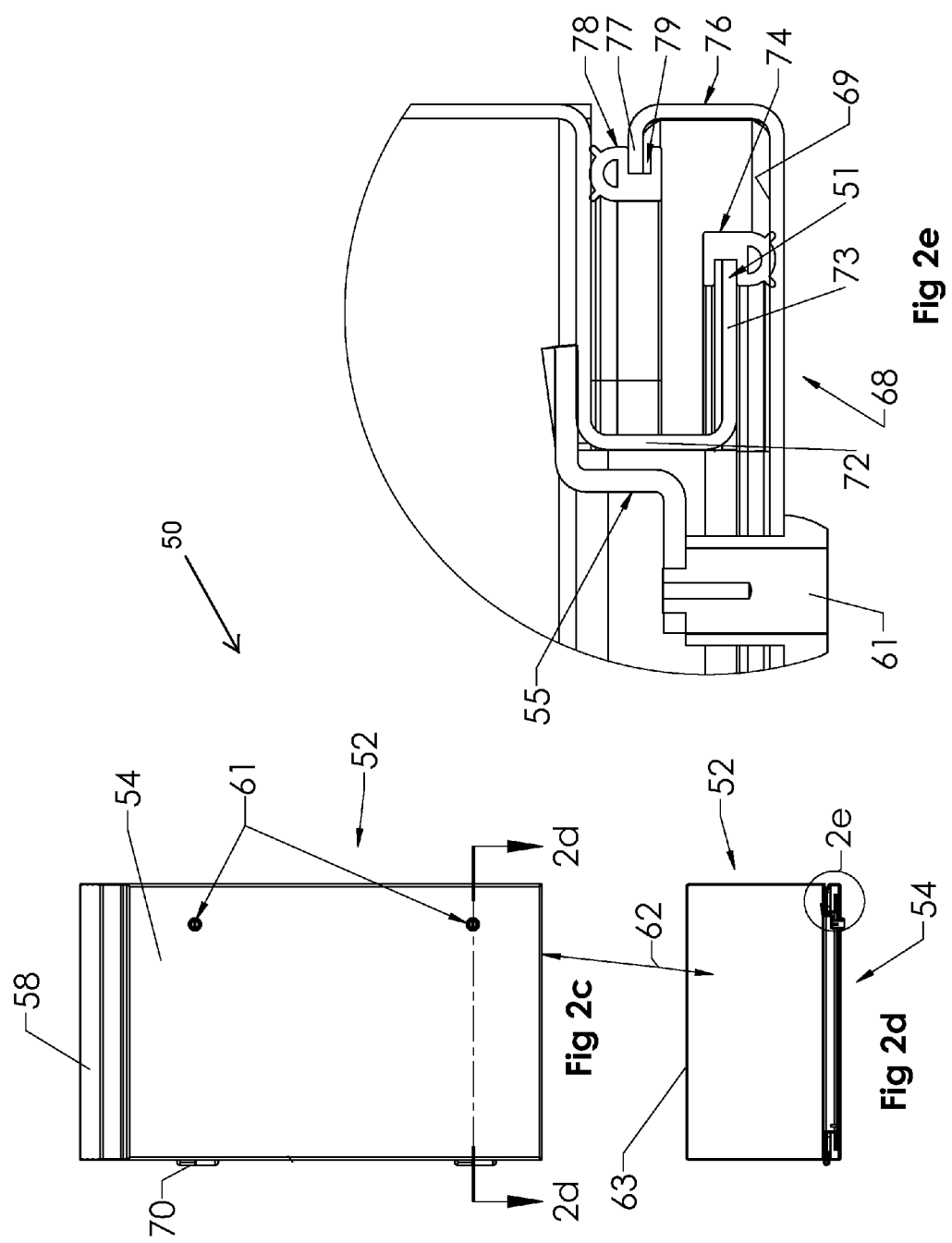

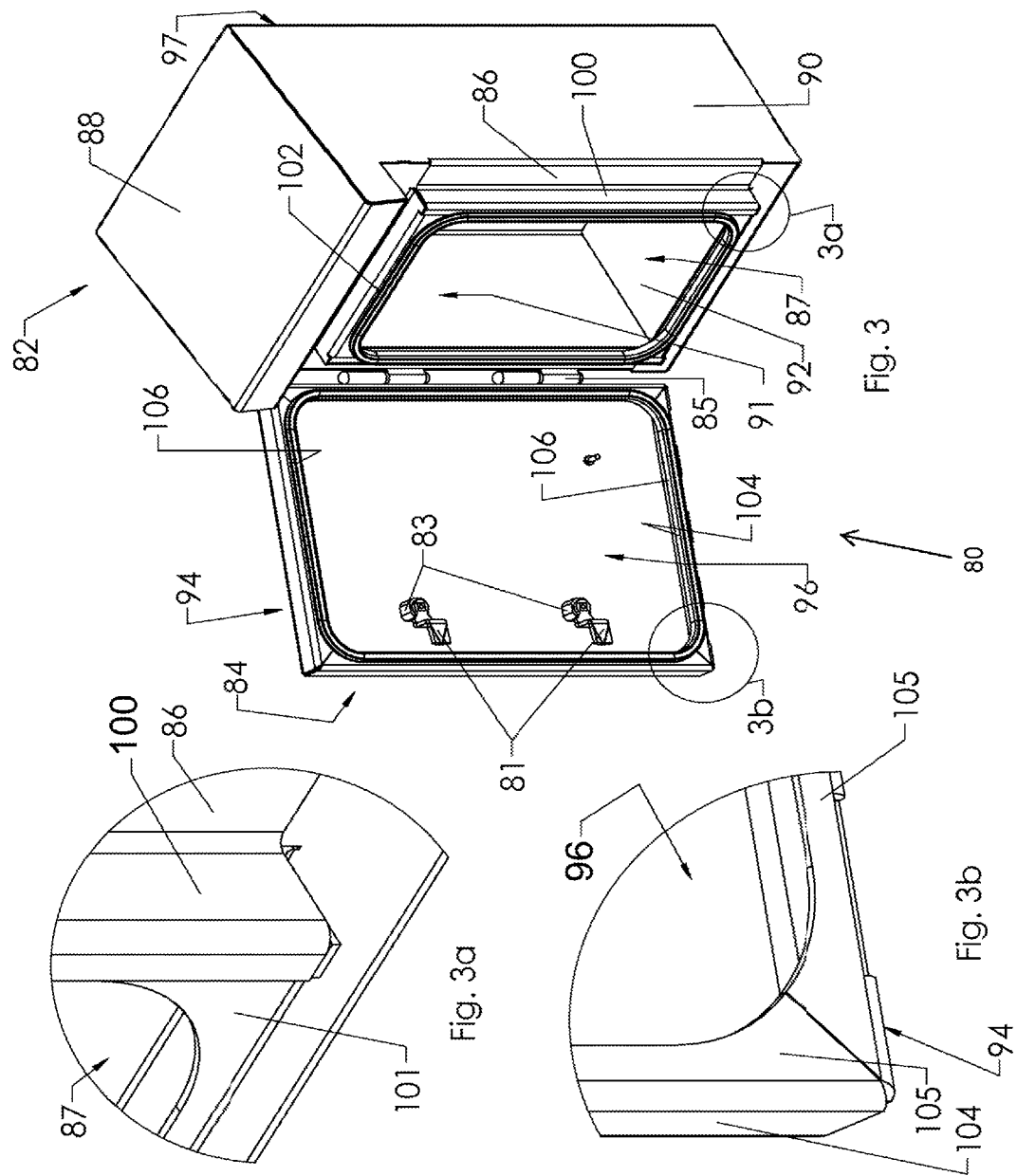

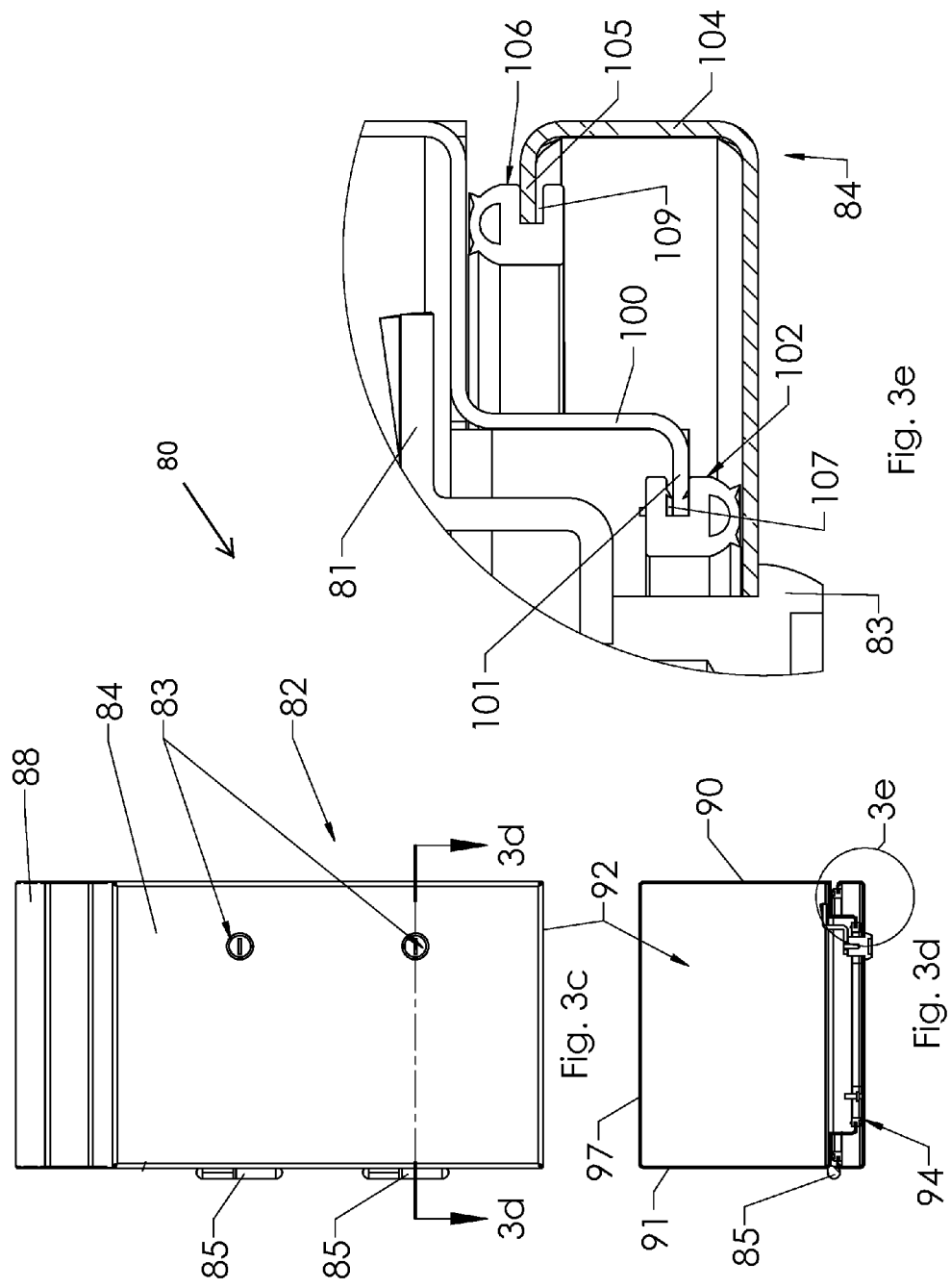

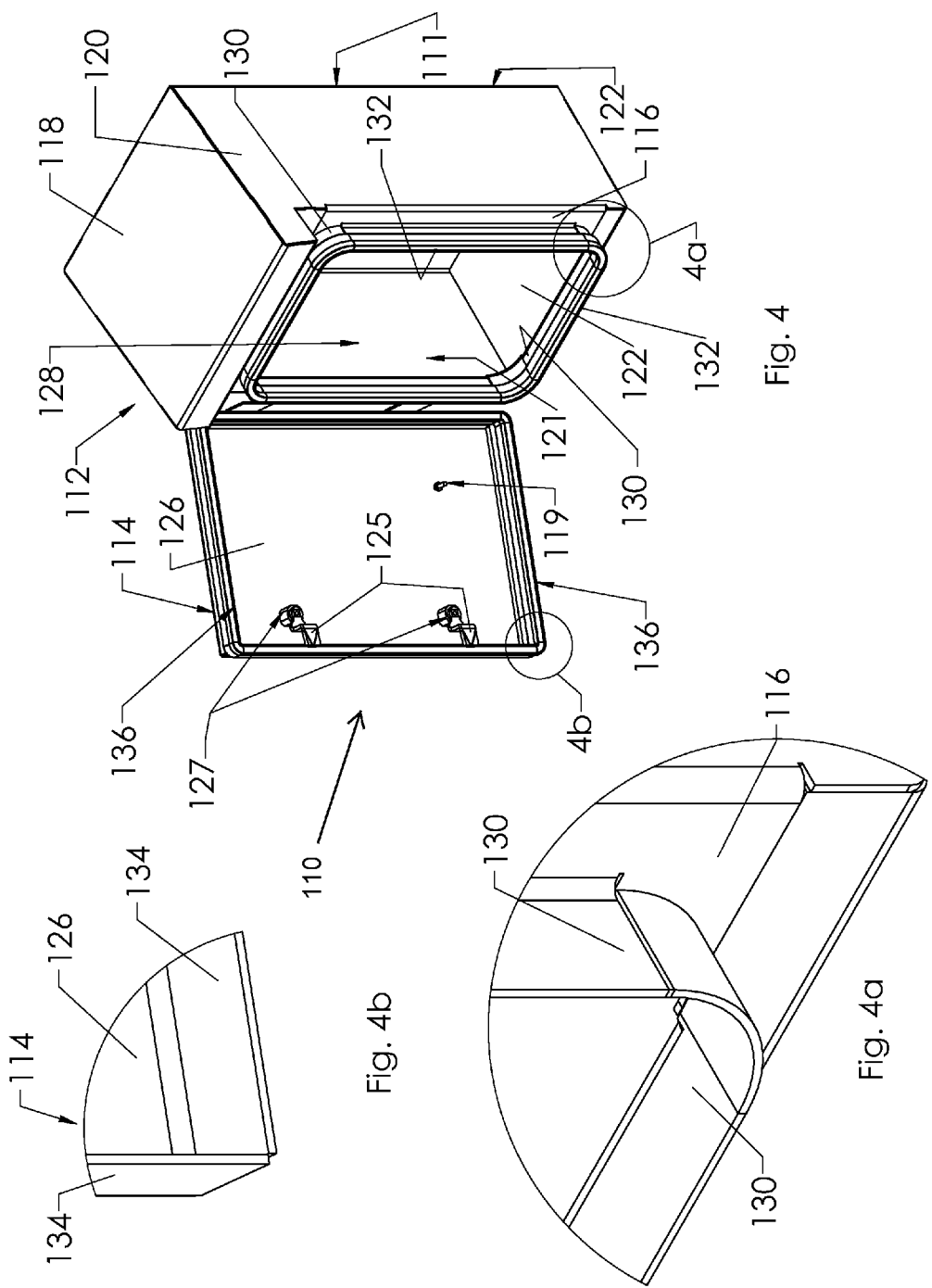

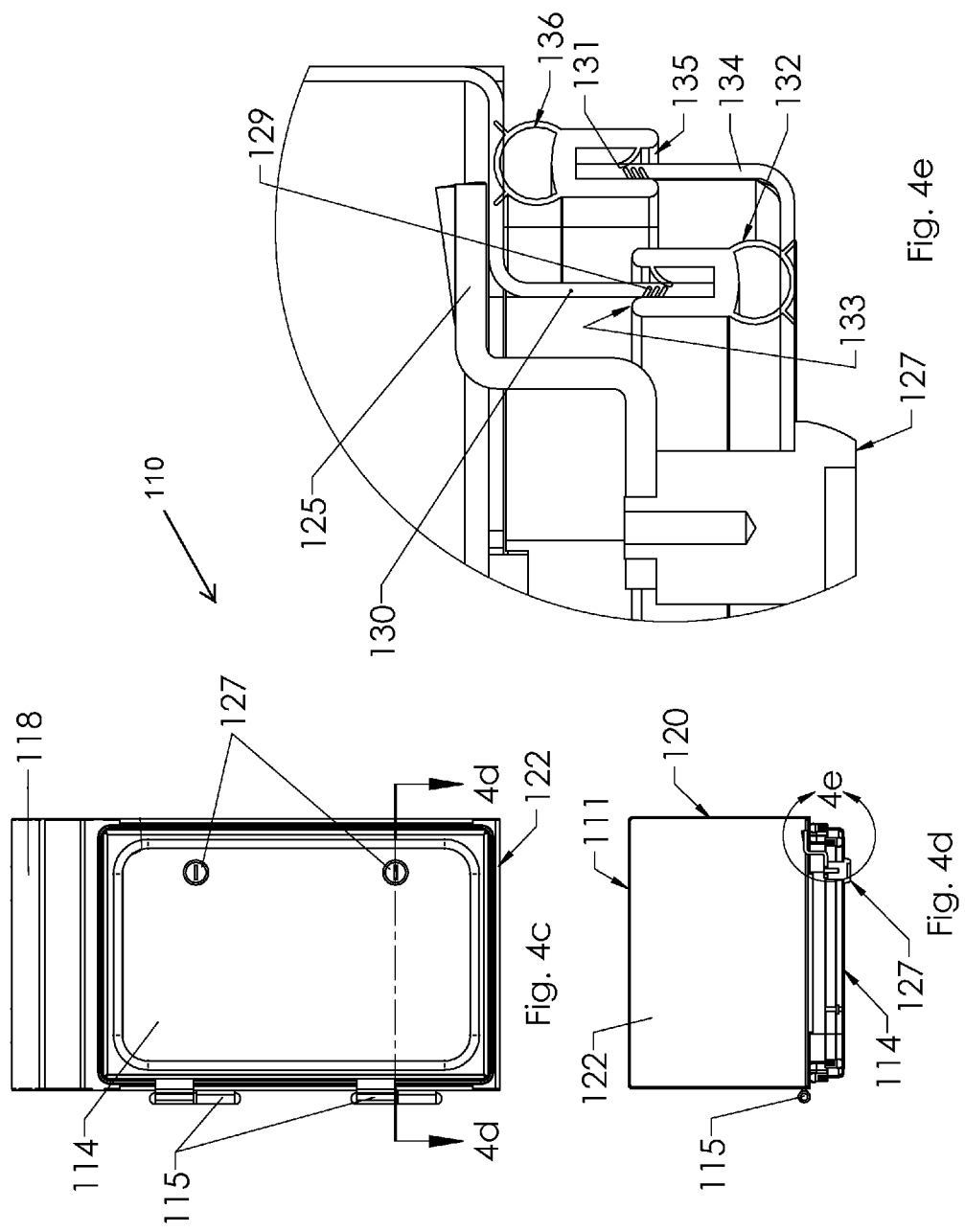

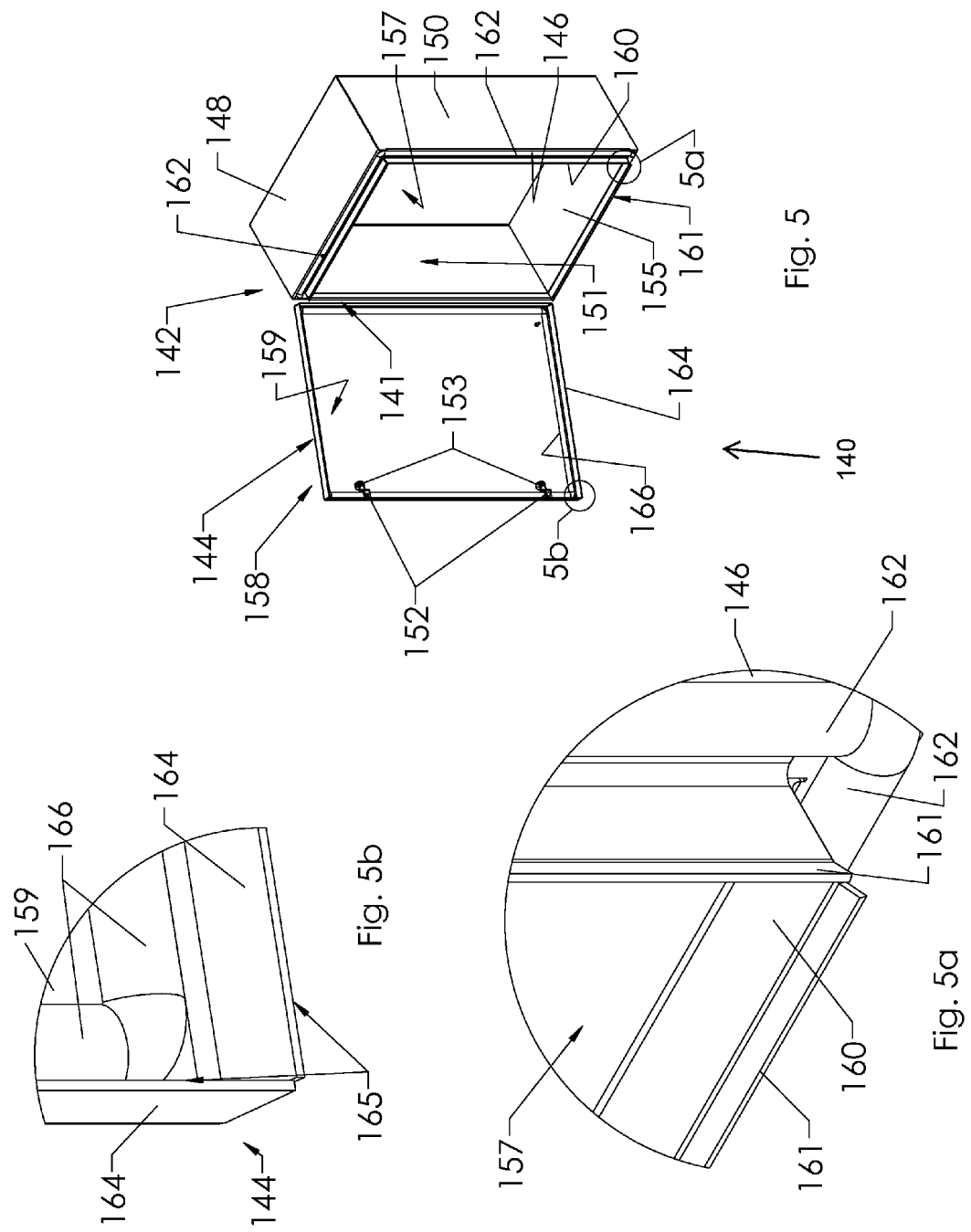

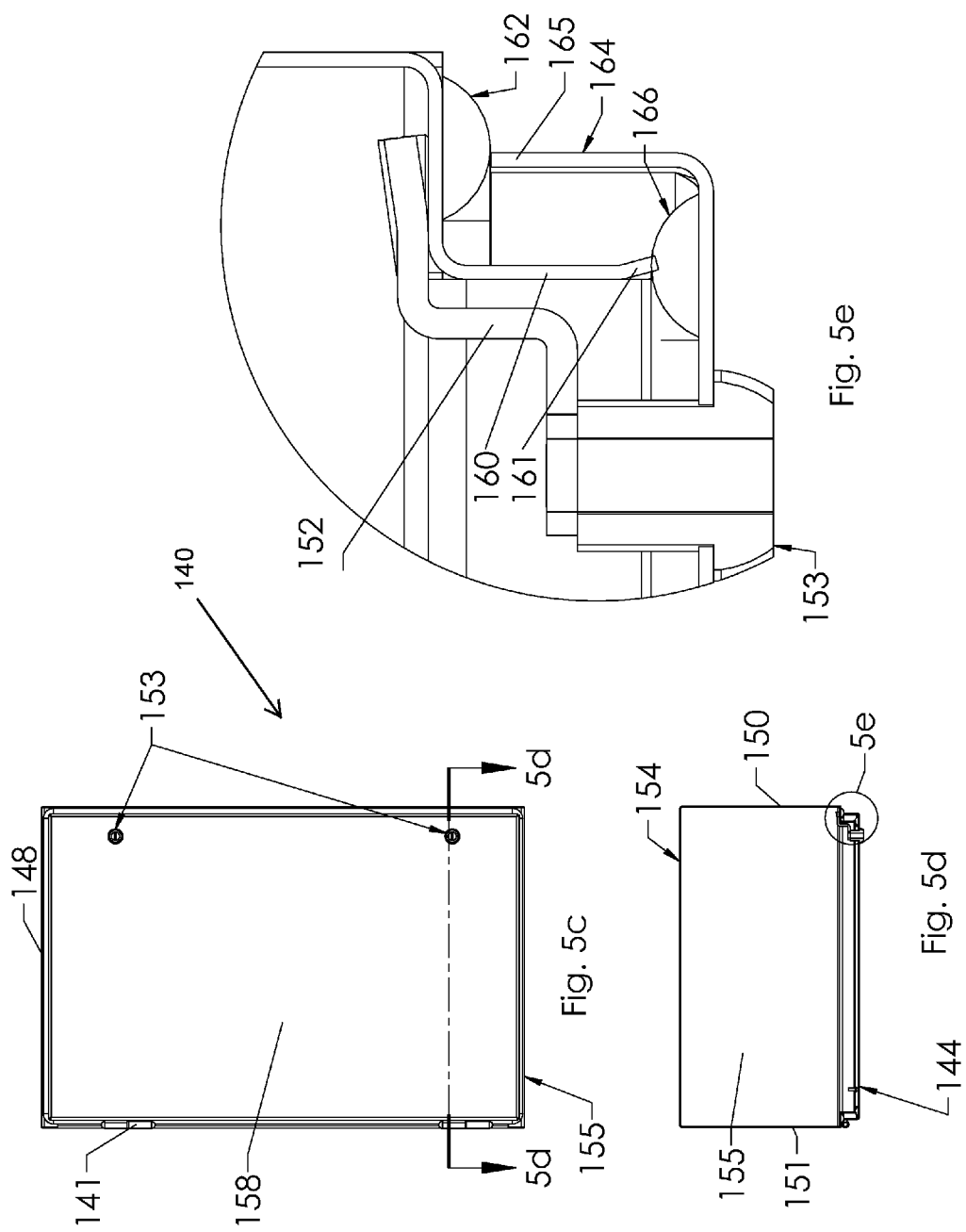

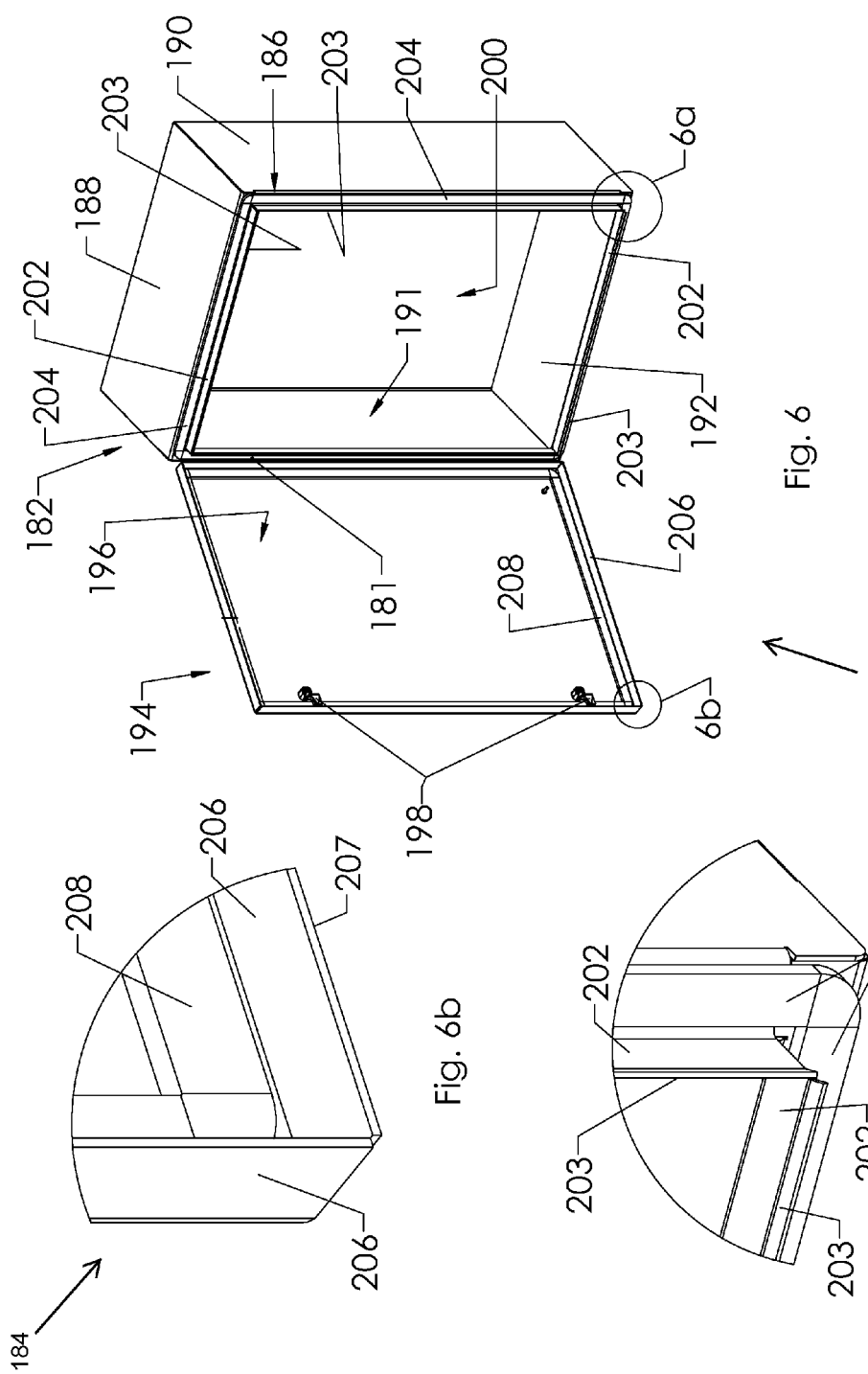

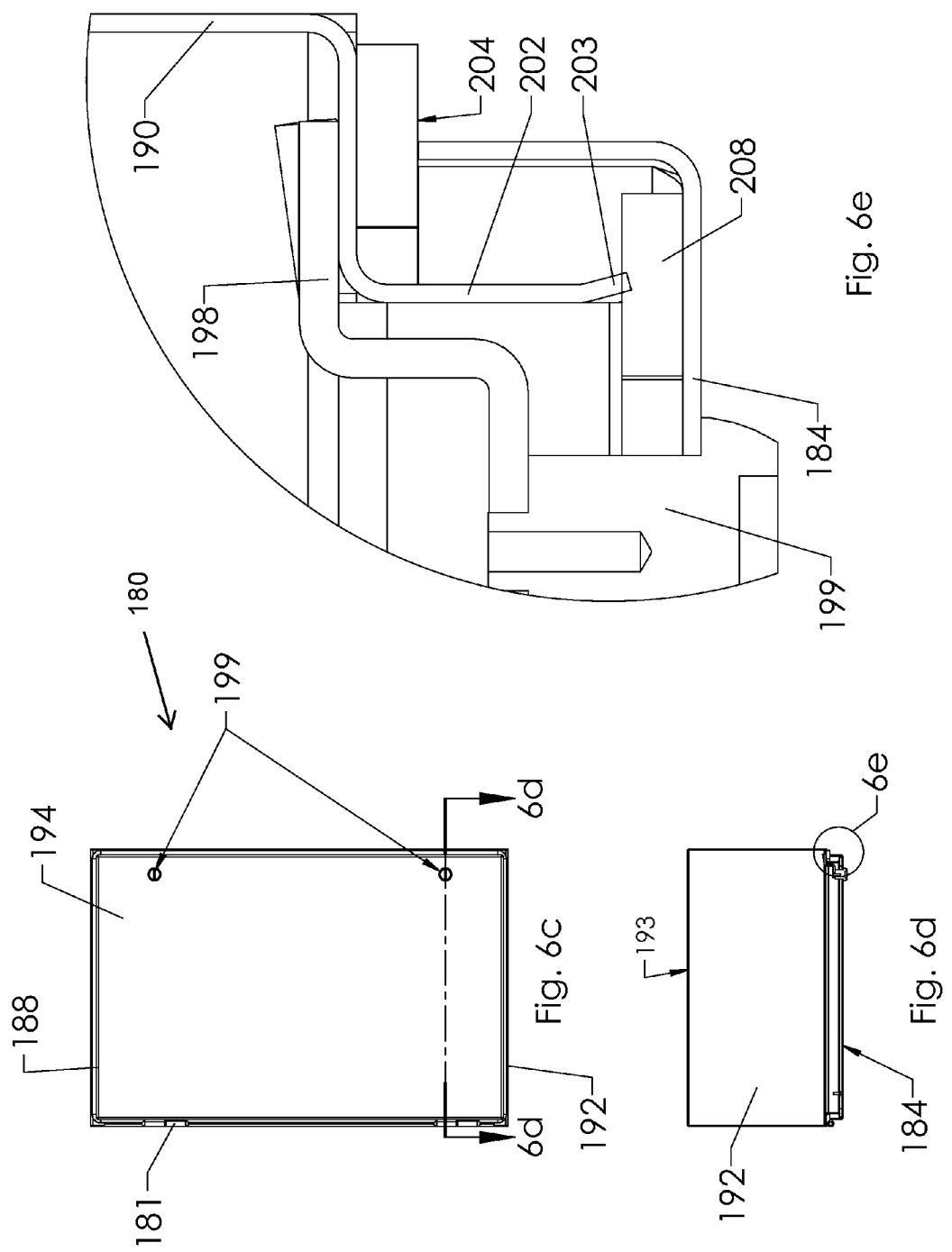

APPARATUS FOR SEALING DOOR OF AN ENCLOSURE

CROSS-REFERENCE TO RELATED APPLICATION

This patent application claims priority to provisional patent application entitled "Double Seal Enclosure" filed on Sep. 16, 2013, having Ser. No. 61/878,054, which is hereby incorporated by reference.

BACKGROUND OF THE INVENTION

Field of the Invention

The present invention relates generally to sealing enclosures, and more particularly, to an apparatus for more effectively sealing a door of a watertight enclosure.

Description of Related Art

Typical electrical enclosures incorporate a single seal system to protect the enclosure from water and dust, whereby the enclosure lip seats against the inside of the enclosure door. These doors typically have a single flange which attempts to stiffen the door for sealing purposes and requires multiple latches to secure the door from leaking. When hit with high pressure wash down equipment these seals fail and water gets into the enclosure.

One conventional technique includes putting drain holes in an enclosure to allow water that penetrated the enclosure water to escape. Another technique, used when an enclosure is in a high pressure wash down area, involves covering the enclosure with plastic bags to help prevent water from entering the enclosure when high pressure (1000 psi) washing is used for cleaning plant equipment.

Accordingly, there is a need for a more effective design for sealing the door of a watertight electrical enclosure.

ASPECTS AND SUMMARY OF THE PRESENT INVENTION

One aspect of the present invention is to provide a sealing apparatus for more effectively sealing the door of a watertight enclosure for electronics.

Another aspect of the present invention is to strengthen a door of a watertight enclosure by providing additional support on the door to prevent the door from misshaping and thus breaching a watertight seal.

The present invention provides a dual sealing system to protect an enclosure from water and dust under very challenging conditions. An outer seal is installed on a door of an enclosure that seals against an outside flange of the enclosure. An inside seal is mounted on a lip of the enclosure that seals against the inside of the door. Doors on the double seal enclosures incorporate an all welded return flange that significantly stiffens the door and allows for less overall latches for proper sealing of the door. The outer seal can be an UL approved gasket, but is not required to meet the UL standards. The double seal design of the present invention significantly reduces the chances of allowing water to pass through both seals on a door when high pressure wash down equipment is being used. The apparatus of the present invention meets the requirements for UL50, UL 508A, and associations of: (1) Underwriters Laboratories, Inc. (UL); (2) Canadian Standards Association (CSA); and (3) Association of Standardization and Certification (ANCE). This inventions is can be used on all types of electrical UL50 and UL 508A enclosures, including: (1) enclosures for indoor locations, Types and/or NEMA rated: 1, 2, 5, 12 and 13; and (2) enclosures for indoor and outdoor locations, Types and/or NEMA rated: 3, 3R, 3S, 4, 4X, 6 and 6P.

In that regard, the present invention provides an apparatus for sealing a door over an opening on an enclosure, the door having a front and a back, and the opening on a front of the enclosure. The door has an inner face and an outer face, and the door is rotatably mounted to the front of the enclosure and configured to cover the opening when the door is closed. A first rim on the front of the enclosure surrounds a periphery of the opening and has a first outer edge. A second rim on the door is sized to surround the periphery of the opening when the door is closed. The second rim also strengthens the door by preventing the door from deforming or becoming bent and thus breaching a watertight seal.

In one embodiment, a first gasket is attached to the first rim and configured to form a watertight seal between the first gasket and the inner face of the door when the door when the door is closed. A second gasket is attached the second rim and configured to form a watertight seal between second gasket and the front of the enclosure when the door is closed.

In another embodiment, a first rim on the front of the enclosure surrounds a periphery of the opening and has a first outer edge, and a second rim on the door having a second outer edge is sized to surround the periphery of the opening when the door is closed. A first gasket is glued to the front of the enclosure and forms a watertight seal against the second rim when the door is closed. A second gasket is glued to the inner side of the door and forms a watertight seal against the first rim when the door is closed.

The foregoing has outlined, rather broadly, the preferred features of the present invention so that those skilled in the art may better understand the detailed description of the invention that follows. Additional features of the invention will be described hereinafter that form the subject of the claims of the invention. Those skilled in the art should appreciate that they can readily use the disclosed invention and specific embodiments as a basis for designing or modifying other structures for carrying out the same purposes of the present invention, and that such other structures do not depart from the spirit and scope of the invention in its broadest form.

BRIEF DESCRIPTION OF THE DRAWINGS

FIG. 1 is a perspective view of a watertight enclosure having a door in the open position and configured in accordance with a first embodiment of the present invention;

FIG. 1a is an enlarged view of the circled portion "1a" of shown in of FIG. 1;

FIG. 1b is an enlarged view of the circled portion "1b" shown in FIG. 1;

FIG. 1c is a front view of the enclosure shown in FIG. 1, wherein the door is in the closed position;

FIG. 1d is a cross-sectional view of the enclosure shown in and taken along line 1d-1d of FIG. 1c, wherein the door is in the closed position;

FIG. 1e is an enlarged view of the circled portion "1e" shown in FIG. 1d;

FIG. 2 is a perspective view of a watertight enclosure having a door in the open position and configured in accordance with a second embodiment of the present invention;

FIG. 2a is an enlarged view of the circled portion "2a" of shown in of FIG. 2;

FIG. 2b is an enlarged view of the circled portion "2b" shown in FIG. 2;

FIG. 2c is a front view of the enclosure shown in FIG. 2, wherein the door is in the closed position;

FIG. 2d is a cross-sectional view of the enclosure shown in and taken along line 2d-2d of FIG. 2c, wherein the door is in the closed position;

FIG. 2e is an enlarged view of the circled portion "2e" shown in FIG. 2d;

FIG. 3 is a perspective view of a watertight enclosure having a door in the open position and configured in accordance with a third embodiment of the present invention;

FIG. 3a is an enlarged view of the circled portion "3a" of shown in of FIG. 3;

FIG. 3b is an enlarged view of the circled portion "3b" shown in FIG. 3;

FIG. 3c is a front view of the enclosure shown in FIG. 3, wherein the door is in the closed position;

FIG. 3d is a cross-sectional view of the enclosure shown in and taken along line 3d-3d of FIG. 3c, wherein the door is in the closed position;

FIG. 3e is an enlarged view of the circled portion "3e" shown in FIG. 3d;

FIG. 4 is a perspective view of a watertight enclosure having a door in the open position and configured in accordance with a fourth embodiment of the present invention;

FIG. 4a is an enlarged view of the circled portion "4a" of shown in of FIG. 4, wherein the gasket has been removed to clearly illustrate the rim;

FIG. 4b is an enlarged view of the circled portion "4b" shown in FIG. 4, wherein the gasket has been removed to clearly illustrate the rim;

FIG. 4c is a front view of the enclosure shown in FIG. 4, wherein the door is in the closed position;

FIG. 4d is a cross-sectional view of the enclosure shown in and taken along line 4d-4d of FIG. 4c, wherein the door is in the closed position;

FIG. 4e is an enlarged view of the circled portion "4e" shown in FIG. 4d;

FIG. 5 is a perspective view of a watertight enclosure having a door in the open position and configured in accordance with a fifth embodiment of the present invention;

FIG. 5a is an enlarged view of the circled portion "5a" of shown in of FIG. 5;

FIG. 5b is an enlarged view of the circled portion "5b" shown in FIG. 5;

FIG. 5c is a front view of the enclosure shown in FIG. 5, wherein the door is in the closed position;

FIG. 5d is a cross-sectional view of the enclosure shown in and taken along line 5d-5d of FIG. 5c, wherein the door is in the closed position;

FIG. 5e is an enlarged view of the circled portion "5e" shown in FIG. 5d;

FIG. 6 is a perspective view of a watertight enclosure having a door in the open position and configured in accordance with a sixth embodiment of the present invention;

FIG. 6a is an enlarged view of the circled portion "6a" of shown in of FIG. 6;

FIG. 6b is an enlarged view of the circled portion "6b" shown in FIG. 6;

FIG. 6c is a front view of the enclosure shown in FIG. 6, wherein the door is in the closed position;

FIG. 6d is a cross-sectional view of the enclosure shown in and taken along line 6d-6d of FIG. 6c, wherein the door is in the closed position; and FIG. 6e is an enlarged view of the circled portion "6e" shown in FIG. 6d.

DETAILED DESCRIPTION OF THE PREFERRED EMBODIMENTS

Referring now to the drawings, FIG. 1a is a perspective view of a watertight enclosure 10 configured in accordance with a preferred embodiment of the present invention. The watertight enclosure 10 includes a housing 12 having a door 14 rotatably mounted to a front 16 of the housing 12. The housing 12 has a top wall 18, side walls 20, 21, and a bottom wall 22. A back panel 24 for mounting electronics is secured or mounted to a back wall 26 (FIG. 1d) of the enclosure 10 using bolts 25. Brackets 28 on the back wall 26 of the housing 12 are used for securing the enclosure 10 to a vertical wall or other mounting surface.

The door 14 is rotatably mounted to the front 16 of the housing 12 using a hinge 30 or other rotatable mounting fixture. The door 14 has an outer or front face 32 (FIG. 1d) and an inner or rear face 34. Rotating levers or arms 35 on the inner face 34 of the door 14 function to lock the door 14 when the door 14 is in a closed the position. The levers 35 rotate to a position behind the front 16 to lock the door 14 in the closed position. A compartment 36 is located on the back face 34 of the door 14 for holding paper instructions. An opening 40 is located on the front 16 of the housing 12. The door 14 covers the opening 40 when the door 14 is in the closed position.

In accordance with the present invention, a first rim 42 surrounds a periphery of the opening 40 and extends perpendicular from the front 16 of the housing 12 as shown in FIG. 1a. A first gasket 44 is located on an outward edge of the first rim 42 to engage the back face 34 of the door 14 and forms a watertight seal when the door 14 is in the closed position. A second rim 46 extends around a periphery of the inner face 34 of the door 14 as shown in FIG. 1b, and the second rim 46 is sized to surround the periphery of the opening 40 when the door 14 is closed. A second gasket 48 is attached the outer edge of the second rim 46 and configured to form a watertight seal between the front 16 of the housing 12 and the second gasket 48 on the rear face 34 of the door 14 when the door 14 is closed. In a preferred embodiment of the present invention, the second rim 46 surrounds the first rim 42 when the door 14 is in the closed position. In other embodiments, however, the first rim 42 can surround the second rim 46 when the door 14 is in the closed position.

FIG. 1a is an enlarged view of circled portion "1a" shown in FIG. 1. Illustrated are the front 16 of the housing 12, the side 20, the first rim 42, and the first gasket 44. The housing 12 preferably is constructed of metal and the first gasket 44 preferably is constructed of rubber.

FIG. 1b is an enlarged view of the circled portion "1b" shown in FIG. 1. Illustrated are the inner face 34 of the door 14, the second rim 46, and the second gasket 48. The door 14 and the second rim 46 are preferably constructed of metal, and the second gasket 48 preferably is constructed of rubber.

FIG. 1c is a front view of the enclosure 10 shown in FIG. 1, wherein the door 14 is in the closed position. Illustrated are knobs 41 of the front of the door 14 of the housing 12. The top 18 and mounting brackets 28 are further illustrated.

FIG. 1d is a cross-sectional view of the enclosure 12 shown in and taken along line 1d-1d of FIG. 1c. FIG. 1d illustrates the door 14 in the closed position and illustrates a cross-sectional view looking toward the bottom 22 of the enclosure 12. Illustrated are the brackets 28, rear or back wall 26, rear panel 24, side walls 20 and 21, hinge 30, and the door 14.

FIG. 1e is an enlarged view of the circled portion "1e" shown in FIG. 1d. Illustrated are the lever 35 attached to rotatable knob or key 41 on the front face 32 of the door 14. Further illustrated are the first gasket 44 attached to the first rim 42. The first gasket 44 includes a slot 47 enabling the first gasket 44 to slide over the first rim 42 to be secured to the first rim 42. The first gasket 44 also can be easily replaced if damaged or worn by sliding the first gasket 44 off the first rim 42, and replaced with a new first gasket 44 that is slid back onto the first rim 42.

The second gasket 48 is shown attached to the first rim 46. The second gasket 48 includes a slot 49 enabling the second gasket 48 to slide over the second rim 46 to be secured to the second rim 46. The second gasket 48 also can be easily replaced if damaged or worn by sliding the second gasket 48 off the second rim 46, and replaced with a new second gasket 48 that is slid back onto the second rim 46.

FIG. 2 is a perspective view of a watertight enclosure 50 configured in accordance with a second embodiment of the present invention. The watertight enclosure 50 includes a housing 52 having a door 54 rotatably mounted to a front 56 of the housing 52. The housing 52 has a top wall 58, side walls 60, 61, and a bottom wall 62. A back panel 64 for mounting electronics is secured or mounted to a back wall 63 (FIG. 2d) of the enclosure 52 using bolts.

The door 54 is rotatably mounted to the front 56 of the housing 52 using a hinge 70 or other rotatable mounting fixture. The door 54 has a front face 68 (FIG. 2d) and a rear face 69. Rotating levers or arms 55 on the rear face 69 of the door 54 function to lock the door 54 when the door 54 is in closed position. The levers 55 rotate to a position behind the front 56 of the housing 52 to lock the door 54 in the closed position. An opening 71 is located on the front 56 of the housing 52. The door 54 covers the opening 71 when the door 54 is in the closed position.

In accordance with the present invention, a first rim 72 (FIG. 2a) surrounds a periphery of the opening 71 and extends perpendicular from the front 56 of the housing 52. The first rim 72 includes a lip or flange 73 that extends parallel to the front 56 of the housing 52. A first gasket 74 is located on an outward edge of the flange 73 of the first rim 72 to engage the back face 69 of the door 54 and forms watertight seal when in the door 54 is in the closed position. A second rim 76 (FIG. 2b) extends perpendicular to and around a periphery of the inner or rear face 69 of the door 54, and the second rim 76 is sized to surround the periphery of the opening 71 when the door 54 is closed. The second rim 76 includes a lip or flange 77 that extends parallel to the rear face 69 of the door 54. A second gasket 78 is attached the flange 77 of the second rim 76 and is configured to form a watertight seal between the front 56 of the housing 52 and the rear face 69 of the door 54 when the door 54 is closed. In a preferred embodiment of the present invention, the second rim 76 surrounds the first rim 72 when the door 54 is in the closed position. In other embodiments, however, the first rim 72 can surround the second rim 74 when the door 54 is in the closed position.

FIG. 2a is an enlarged view of circled portion "2a" shown in FIG. 2. Illustrated are the front 56 of the housing 52, the side 60, and the first rim 72. The first gasket 74 is not illustrated in FIG. 2a in order to more clearly illustrate the first flange 73 of the first rim 72. The first flange 73 extends perpendicular and outward from the first rim 72. The first gasket 72 is located on the first flange 73 of the first rim 72, as shown in FIG. 2. The door 54 and the first rim 72 are preferably constructed of metal, and the first gasket 74 preferably is constructed of rubber.

FIG. 2b is an enlarged view of the circled portion "2b" shown in FIG. 2. Illustrated are the inner face 69 of the door 54, the second rim 76, and the flange 77 of the second rim 76. The second gasket 78 is not illustrated in FIG. 2b in order to more clearly illustrate the second flange 77 on the second rim 76. The second flange 77 extends perpendicular to and inward from the second rim 76. The door 54 and the second rim 76 are preferably constructed of metal, and the second gasket 78 preferably is constructed of rubber.

FIG. 2c is a front view of the enclosure 50 shown in FIG. 2, wherein the door 54 is in the closed position. Illustrated are knobs 61, door hinges 70, and top 58 of the housing 52.

FIG. 2d is a cross-sectional view of the enclosure 52 shown in and taken along line 2d-2d of FIG. 2c. FIG. 2d illustrates the door 54 in the closed position and illustrates a cross-sectional view looking toward the bottom 62 of the enclosure 52.

FIG. 2e is an enlarged view of the circled portion "2e" shown in FIG. 2d. Illustrated are the lever 55 attached to rotatable knob or key 61 on the front face 68 of the door 54. Further illustrated are the first gasket 74 attached to first flange 75 of the first rim 22. The first gasket 74 includes a slot 51 enabling the first gasket 74 to slide over the first flange 73 of the first rim 72 to be secured to the first rim 72. The first gasket 74 also can be easily replaced if damaged or worn by sliding the first gasket 74 off the first flange 73, and replaced with a new first gasket 74 that is slid back onto the first flange 73.

The second gasket 78 is shown attached to the second flange 77 of the second rim 76. The second gasket 78 includes a slot 79 enabling the second gasket 78 to slide over the second flange 77 of the second rim 76 to be secured to the second flange 77. The second gasket 78 also can be easily replaced if damaged or worn by sliding the second gasket 78 off the second flange 77, and replaced with a new second gasket 78 that is slid back onto the second flange 77 of the second rim 76.

FIG. 3 is a perspective view of a watertight enclosure 80 configured in accordance with a third embodiment of the present invention. The watertight enclosure 80 includes a housing 82 having a door 84 rotatably mounted to a front 86 of the housing 82. The housing 82 has a top wall 88, side walls 90, 91, and a bottom wall 92. A back panel inside the enclosure 82 for mounting electronics is secured or mounted to a back wall 97 (FIG. 3d) of the enclosure 82 using bolts.

The door 84 is rotatably mounted to the front 86 of the housing 82 using a hinge 85 or other rotatable mounting fixture. The door 84 has a front face 94 (FIG. 2d) and a rear face 96. Rotating levers or arms 81 on the rear face 96 of the door 84 function to lock the door 84 when the door 84 is in the closed position. The levers 81 rotate to a position behind the front 86 to lock the door 84 in the closed position. An opening 87 is located on the front 86 of the housing 82. The door 84 covers the opening 87 when the door 84 is in the closed position.

In accordance with the present invention, a first rim 100 surrounds a periphery of the opening 87 and extends perpendicular from the front 86 of the housing 52. The first rim 100 includes a first flange 101 that extends parallel to and inwards of the front 86 of the housing 82. A first gasket 102 is located on an outward edge of the first flange 101 of the first rim 100 to engage the back face 96 of the door 84 and forms a watertight seal when in the door 84 is in the closed position. A second rim 104 extends around a periphery of the inner or rear face 96 of the door 84, and the second rim 104 is sized to surround the periphery of the opening 87 when the door 84 is closed. The second rim 104 extends perpendicular to the rear face 96 of the door 84. The second rim 104 includes a flange 105 that extends parallel to and inward to the rear face 96 of the door 84. A second gasket 106 is attached the edge of the second rim 104 and configured to form a watertight seal between the front 86 of the housing 82 and the rear face 96 of the door 84 when the door 84 is closed. In a preferred embodiment of the present invention, the second rim 104 surrounds the first rim 100 when the door 84 is in the closed position. In other embodiments, however, the first rim 100 can surround the second rim 104 when the door 84 is in the closed position.

FIG. 3a is an enlarged view of circled portion "3a" shown in FIG. 3. Illustrated are the front 86 of the housing 82 and the first flange 101 of the first rim 100. The first gasket 102 is not illustrated in FIG. 3a in order to more clearly illustrate the first lip or first flange 101 on the first rim 100. The first flange 101 extends perpendicular to the first rim 100 and inward towards the opening 87 from the first rim 100. The first gasket 102 is located on the edge of the first flange 101 of the first rim 100. The door 84 and the first rim 100 are preferably constructed of metal, and the first gasket 102 preferably is constructed of rubber.

FIG. 3b is an enlarged view of the circled portion "3b" shown in FIG. 3. Illustrated are the inner face 96 of the door 94 and the second flange 105 of the second rim 104. The second gasket 106 is not illustrated in FIG. 3b in order to more clearly illustrate the second flange 105 of the second rim 104. The second flange 105 extends perpendicular to the second rim 104 and inward toward the door 84. The door 84 and the second rim 104 are preferably constructed of metal, and the second gasket 106 preferably is constructed of rubber.

FIG. 3c is a front view of the enclosure 80 shown in FIG. 3, wherein the door 84 is in the closed position. Illustrated are the door 84, knobs 83, and hinges 85 on the housing 82.

FIG. 3d is a cross-sectional view of the enclosure 82 shown in and taken along line 3d-3d of FIG. 3c. FIG. 3d illustrates the door 84 in the closed position and illustrates a cross-sectional view looking toward the bottom 92 of the enclosure 82.

FIG. 3e is an enlarged view of the circled portion "3e" shown in FIG. 3d. Illustrated is the lever 81 attached to the rotatable knob or key 83 on the front face 94 of the door 84. Further illustrated are the first gasket 102 attached to first flange 101 of the first rim 100. The first gasket 102 includes a slot 107 enabling the first gasket 102 to slide over the first flange 101 of the first rim 100 to be secured to the first rim 100. The first gasket 102 also can be easily replaced if damaged or worn by sliding the first gasket 102 off the first flange 101, and replaced with a new first gasket 102 that is slid back onto the first flange 101.

The second gasket 106 is shown attached to the second flange 105 of the second rim 104. The second gasket 106 includes a slot 109 enabling the second gasket 106 to slide over the second flange 105 of the second rim 104 to be secured to the second flange 105. The second gasket 106 also can be easily replaced if damaged or worn by sliding the second gasket 106 off the second flange 105, and replaced with a new second gasket 106 that is slid back onto the second flange 105 of the second rim 104.

FIG. 4 is a perspective view of a watertight enclosure 110 configured in accordance with a fourth embodiment of the present invention. The watertight enclosure 110 includes a housing 112 having a door 114 rotatably mounted to a front 116 of the housing 112. The housing 112 has a top wall 118, side walls 120 and 121, and a bottom wall 122. A back panel inside the enclosure 112 for mounting electronics is secured or mounted to a back wall 114 (FIG. 4d) of the enclosure 112 using bolts.

The door 114 is rotatably mounted to the front 116 of the housing 112 using a hinge 115 (FIG. 4c) or other rotatable mounting fixture. The door 114 has a front face 124 (FIG. 2d) and a rear face 126. Rotating levers or arms 125 on the door 114 function to lock the door 114 when the door 114 is in closed position. The levers 125 rotate to a position behind the front 116 to lock the door 114 in the closed position. An opening 128 is located on the front 116 of the housing 112. The door 114 covers the opening 128 when the door 114 is in the closed position. A grounding screw or post 119 is included on the rear face 126 of the door 114 for grounding electronics to be contained within the enclosure 110.

In accordance with the present invention, a first rim 130 surrounds a periphery of the opening 128 and extends perpendicular from the front 116 of the housing 112. A first gasket 132 is located on an outward edge of the first rim 130 to engage the back face 126 of the door 114 and forms a watertight seal when the door 114 is in the closed position. A second rim 134 extends around a periphery of the inner or rear face 116 of the door 114, and the second rim 134 is sized to surround the periphery of the opening 128 when the door 114 is closed. A second gasket 136 is attached the second rim 134 and configured to form a watertight seal between the front 116 of the housing 112 and the rear face 126 of the door 114 when the door 114 is closed. In a preferred embodiment of the present invention, the second rim 134 surrounds the first rim 130 when the door 114 is in the closed position. In other embodiments, however, the first rim 130 can surround the second rim 134 when the door 114 is in the closed position.

FIG. 4a is an enlarged view of circled portion "4a" shown in FIG. 4. Illustrated are the front 116 of the housing 112 and the first rim 130. The first gasket 132 is not illustrated in FIG. 4a in order to better illustrate the first rim 130. The first rim 130 extends perpendicular from the front 116 of the enclosure 112. The first gasket 132 is located on the edge of the first rim 130. The first rim 130 preferably is constructed of metal, and the first gasket 132 preferably is constructed of rubber.

FIG. 4b is an enlarged view of the circled portion "4b" shown in FIG. 4. Illustrated are the inner face 126 of the door 114 and the second rim 134. The second gasket 136 is not illustrated in FIG. 4b in order to better illustrate the second rim 134. The second rim 134 extends perpendicular from the inner face 126 of the door 114. The door 114 and the second rim 134 preferably are constructed of metal, and the second gasket 136 preferably is constructed of rubber.

FIG. 4c is a front view of the enclosure 110 shown in FIG. 4, wherein the door 114 is in the closed position. Illustrated are the door 114, the top 118, the knobs 127, and hinges 115 on the housing 112.

FIG. 4d is a cross-sectional view of the enclosure 112 shown in and taken along line 4d-4d of FIG. 4c. FIG. 4d illustrates the door 114 in the closed position and illustrates a cross-sectional view looking toward the bottom 122 of the enclosure 112.

FIG. 4e is an enlarged view of the circled portion "4e" shown in FIG. 4d. Illustrated is the lever 125 attached to the rotatable knob or key 127 on the front face 124 of the door 114. Further illustrated are the first gasket 132 attached to edge of the first rim 130. The first gasket 132 includes a slot 133 enabling the first gasket 132 to slide over the edge of the first rim 130 to be secured to the first rim 130. The first gasket 132 also can be easily replaced if damaged or worn by sliding the first gasket 132 off the first rim 130, and replaced with a new first gasket 132 that is slid back onto the first rim 130.

The second gasket 136 is shown attached to the edge of the second rim 134. The second gasket 136 includes a slot 135 enabling the second gasket 136 to slide over the edge of the second rim 134 and be secured to the second rim 134. The second gasket 136 also can be easily replaced if damaged or worn by sliding the second gasket 136 off the second rim 134, and replaced with a new second gasket 136 that is slid back onto the second rim 134. Fingers 131 inside of the slot 135 of the second gasket 136, and fingers 129 inside the slot 133 of the first gasket 132, grip onto the rims 134 and 130, respectively, to secure the gaskets 136 and 132 onto their respective rims 134 and 130.

FIG. 5 is a perspective view of a watertight enclosure 140 configured in accordance with a fifth embodiment of the present invention. The watertight enclosure 140 includes a housing 142 having a door 144 rotatably mounted to a front 146 of the housing 142. The housing 142 has a top wall 148, side walls 150 and 151, and a bottom wall 155. A back panel for mounting electronics is secured or mounted to a back wall 154 (FIG. 5d) of the enclosure 142 using bolts.

The door 144 is rotatably mounted to the front 146 of the housing 142 using a hinge 141 (FIG. 5c) or other rotatable mounting fixture. The door 144 has a front face 158 (FIG. 2d) and a rear face 159. Rotating levers or arms 152 on the door 144 function to lock the door 144 when the door 144 is in a closed position. The levers 152 rotate to a position behind the front 146 to lock the door 144 in the closed position. An opening 157 is located on the front 146 of the housing 142. The door 144 covers the opening 157 when the door 144 is in the closed position.

In accordance with the present invention, a first rim 160 surrounds a periphery of the opening 157 and extends perpendicular from the front 146 of the housing 142. A second rim 164 extends around a periphery of the inner or rear face 159 of the door 144, and the second rim 164 is sized to surround the periphery of the opening 157 when the door 144 is closed. A curved first gasket or rubber padding or sealing material 162 is glued to the front 146 of the housing 142 and surrounds the periphery of the first rim 160. A second curved gasket or rubber padding or sealing material 166 is glued to the inner face 159 of the door 144 and is located inside the periphery of the second rim 164.

An outward edge or flange 161 of the first rim 160 is shown as being flared in FIGS. 5a and 5c, but can be straight, and is configured to engage the second curved gasket 166 on the back face 159 of the door 144 and forms a watertight seal when in the door 144 is in the closed position. An outward edge or flange 165 of the second rim 164 is illustrated as being straight in FIGS. 5b and 6e, but can be flared, and is configured to engage the first curved gasket 162 on the front 146 of the housing 142 and forms a watertight seal when in the door 144 is in the closed position. The second rim 164 surrounds the first rim 160 when the door 144 is in the closed position. In other embodiments, however, the first rim 160 can surround the second rim 164 when the door 144 is in the closed position.

FIG. 5a is an enlarged view of circled portion "5a" shown in FIG. 5. Illustrated are the front 146 of the housing 142 and the first rim 160 and the first curved gasket 162. The first rim 160 extends perpendicular and outward from the front 146 of the housing 142. The first gasket 162 is located on the front 146 of the housing 142. The first rim 160 is preferably constructed of metal, and the first curved gasket 162 preferably is constructed of rubber. The first rim 160 can be straight or include a flared or curve edge or flange 161, as illustrated.

FIG. 5b is an enlarged view of the circled portion "5b" shown in FIG. 5. Illustrated are the inner face 159 of the door 144, the second rim 164, and the second curved gasket 166. The second rim 164 extends perpendicular and outward from the rear face 159 of the door 144. The outer edge 165 of the second rim 164 can be straight or flared or curved, but is illustrated as being straight in FIG. 5b. The door 144 and the second rim 164 are preferably constructed of metal, and the second gasket 166 preferably is constructed of rubber.

FIG. 5c is a front view of the enclosure 140 shown in FIG. 5, wherein the door 54 is in the closed position. Illustrated are knobs 153, door hinges 141, and top 148 of the housing 142.

FIG. 5d is a cross-sectional view of the enclosure 142 shown in and taken along line 5d-5d of FIG. 5c. FIG. 5d illustrates the door 144 in the closed position and illustrates a cross-sectional view looking toward the bottom 155 of the enclosure 142.

FIG. 5e is an enlarged view of the circled portion "5e" shown in FIG. 5d. Illustrated are the lever 152 attached to rotatable knob or key 153 on the front face 158 of the door 144. Further illustrated are the first curved gasket 162 attached to front of the housing 142. The second curved gasket 166 is shown attached to the rear face 159 of the door 144.

FIG. 6 is a perspective view of a watertight enclosure 180 configured in accordance with a sixth embodiment of the present invention. The watertight enclosure 180 includes a housing 182 having a door 184 rotatably mounted to a front 186 of the housing 182. The housing 182 has a top wall 188, side walls 190 and 191, and a bottom wall 192. A back panel for mounting electronics is secured or mounted to a back wall 193 (FIG. 6d) of the housing 182 using bolts.

The door 184 is rotatably mounted to the front 186 of the housing 182 using a hinge 181 (FIG. 6c) or other rotatable mounting fixture. The door 184 has a front face 194 (FIG. 6d) and a rear face 196. Rotating levers or arms 198 on the door 184 function to lock the door 184 when the door 184 is in closed position. The levers 198 rotate to a position behind the front 186 to lock the door 184 in the closed position. An opening 200 is located on the front 186 of the housing 182. The door 184 covers the opening 200 when the door 184 is in the closed position.

In accordance with the present invention, a first rim 202 surrounds a periphery of the opening 200 and extends perpendicular from the front 186 of the housing 182. A second rim 206 extends around a periphery of the inner or rear face 196 of the door 184, and the second rim 206 is sized to surround the periphery of the opening 200 when the door 184 is closed. A flat first gasket or rubber padding or sealing material 204 is glued to the front 186 of the housing 182 and surrounds the periphery of the first rim 202. A second flat gasket or rubber padding or sealing material 208 is glued to the inner face 196 of the door 184 and is located inside the periphery of the second rim 206.

An outward edge 203 of the first rim 202 can be straight or flared, as illustrated in FIGS. 6a and 6e, and is configured to engage the second flat gasket 208 on the back face 196 of the door 184 and forms a watertight seal when in the door 184 is in the closed position. An outward edge 207 of the second rim 206 can be flared or straight, as illustrated in FIGS. 6b and 6e, and is configured to engage the first flat gasket 204 on the front 186 of the housing 182 and forms a watertight seal when in the door 184 is in the closed position. The second rim 206 surrounds the first rim 202 when the door 184 is in the closed position. In other embodiments, however, the first rim 202 can surround the second rim 206 when the door 184 is in the closed position.

FIG. 6a is an enlarged view of circled portion "6a" shown in FIG. 6. Illustrated are the front 186 of the housing 182 and the first rim 202 and the first flat gasket 204. The first rim 202 extends perpendicular and outward from the front 186 of the housing 182. The first flat gasket 204 is located on the front 186 of the housing 182. The first rim 202 is preferably constructed of metal, and the first flat gasket 204 preferably is constructed of rubber. The first rim 202 can be straight or include a flared or curve edge 203.

FIG. 6b is an enlarged view of the circled portion "6b" shown in FIG. 6. Illustrated are the inner face 196 of the door 184, the second rim 206, and the second flat gasket 208. The second rim 206 extends perpendicular and outward from the rear face 196 of the door 184. The outer edge 207 of the second rim 206 can be flared or curved, but is illustrated as being straight in FIGS. 6b and 6e. The door 184 and the second rim 206 are preferably constructed of metal, and the second flat gasket 208 preferably is constructed of rubber.

FIG. 6c is a front view of the enclosure 180 shown in FIG. 6, wherein the door 184 is in the closed position. Illustrated are knobs 199, door hinges 181, and top 188 of the housing 182.

FIG. 6d is a cross-sectional view of the enclosure 182 shown in and taken along line 6d-6d of FIG. 6c. FIG. 6d illustrates the door 184 in the closed position and illustrates a cross-sectional view looking toward the bottom 192 of the enclosure 182.

FIG. 6e is an enlarged view of the circled portion "6e" shown in FIG. 6d. Illustrated are the lever 198 attached to rotatable knob or key 199 on the front face 194 of the door 184. Further illustrated are the first flat gasket 204 attached to front 186 of the housing 182. The second flat gasket 208 is shown attached to the rear face 196 of the door 184.

While specific embodiments have been shown and described to point out fundamental and novel features of the invention as applied to the preferred embodiments, it will be understood that various omissions and substitutions and changes of the form and details of the invention illustrated and in the operation may be done by those skilled in the art, without departing from the spirit of the invention.

The invention claimed is:

1. An apparatus for sealing an enclosure, comprising:
 a housing having a front surface, a back surface, and first and second side surfaces, and wherein the housing defines an opening in a front of the housing;
 a door having an inner face and an outer face, and the door being rotatably mounted to the housing and configured to cover the opening when the door is closed;
 a first rim that extends entirely from and substantially perpendicular to the front surface of the housing, the first rim having rounded corners as the first rim surrounds a periphery of the opening, and wherein the first rim includes a first outer edge;
 a first gasket attached to the first rim having rounded corners as the first gasket surrounds the periphery of the opening and is configured to form a watertight seal between the first rim and the door when the door is closed;
 a second rim on the door having rounded corners as the second rim surrounds the periphery of the opening when the door is closed, and wherein an outer end of the second rim curves inward back towards a center of the door so as to extend parallel with the inner face of the door, thereby adding additional strength and seal integrity to the door;
 a second gasket attached to the second rim having rounded corners as the second gasket surrounds the periphery of the opening and is configured to form a watertight seal between the front surface of the housing and the door when the door is closed; and
 wherein the first gasket and the second gasket provide a double seal between the front of the housing and the door when the door is closed.

2. The apparatus of claim 1, wherein the second rim surrounds an outer periphery of the first rim when the door is closed.

3. The apparatus of claim 1, wherein the second-gasket surrounds an outer periphery of the first gasket when the door is closed.

4. The apparatus of claim 1, wherein the first rim is surrounded by the second rim when the door is in a closed position.

5. The apparatus of claim 1, wherein the first rim extends perpendicular to the front surface of the housing.

6. The apparatus of claim 1, wherein the first gasket includes a first slot for sliding over the first rim to attach the first gasket to the first rim, and the first slot in the first gasket enables the first gasket to be easily replaced when damaged.

7. The apparatus of claim 6, wherein the first gasket includes fingers in the slot of the first gasket for gripping the first rim and preventing the first gasket from slipping off the first rim.

8. The apparatus of claim 1, wherein the second gasket includes a second slot for sliding over the second rim to attach the second gasket to the second rim, and the second slot in the second gasket enables the second gasket to be easily replaced when damaged.

9. The apparatus of claim 8, wherein the second gasket includes fingers in the slot of the second gasket for gripping the second rim and preventing the second gasket from slipping off the second rim.

10. The apparatus of claim 1, wherein the second gasket is glued onto the inner face of the door.

11. The apparatus of claim 1, wherein the door is rotatably connected to the housing using a hinge.

12. The apparatus of claim 1, wherein a top center of the second gasket forms an arch so as to enable liquids to flow off a top of the second gasket.

13. An apparatus for sealing an enclosure, comprising:
 a housing having a front surface, a back surface, and first and second side surfaces, and wherein the housing defines an opening in a front of the housing;
 a door having an inner face and an outer face, and the door being rotatably mounted to the housing and configured to cover the opening when the door is closed;
 a first rim that extends entirely from and substantially perpendicular to the front surface of the housing, the first rim having radiused corners as the first rim surrounds a periphery of the opening, and wherein the first rim includes a first outer edge;
 a first gasket attached to the first rim having radiused corners as the first gasket surrounds the periphery of the opening and is configured to form a watertight seal between the first rim and the door when the door is closed;
 a second rim on the door having radiused corners as the second rim surrounds the periphery of the opening when the door is closed, and wherein an outer end of the second rim curves inward back towards a center of the door so as to extend parallel with the inner face of the door, thereby adding additional strength and seal integrity to the door;

a second gasket attached to the second rim having radiused corners as the second gasket surrounds the periphery of the opening and is configured to form a watertight seal between the front surface of the housing and the door when the door is closed; and wherein the first gasket and the second gasket provide a double seal between the front of the housing and the door when the door is closed.

14. The apparatus of claim 13, where the second gasket surrounds the first gasket when the door is closed.

15. The apparatus of claim 13, further comprising:

a bracket connected to the back surface of the housing for mounting the apparatus to a vertical wall.

16. The apparatus of claim 13, wherein a top center of the second gasket forms an arch so as to enable liquids to flow off a top of the second gasket.

\* \* \* \* \*